United States Patent [19]
Proctor et al.

[11] Patent Number: 5,898,338
[45] Date of Patent: Apr. 27, 1999

[54] ADAPTIVE DIGITAL PREDISTORTION LINEARIZATION AND FEED-FORWARD CORRECTION OF RF POWER AMPLIFIER

[75] Inventors: James A. Proctor, Los Gatos; Lance Todd Mucenieks, Boulder Creek, both of Calif.

[73] Assignee: Spectrian, Sunnyvale, Calif.

[21] Appl. No.: 08/717,500

[22] Filed: Sep. 20, 1996

[51] Int. Cl.$^6$ .................................................. H03F 1/26
[52] U.S. Cl. ............................................ 330/149; 330/151
[58] Field of Search .................................. 330/129, 136, 330/149, 151; 455/126

[56] References Cited

U.S. PATENT DOCUMENTS

| 4,291,277 | 9/1981 | Davis et al. | 330/149 |
| 5,650,758 | 7/1997 | Xu et al. | 330/149 |

OTHER PUBLICATIONS

"Adaptive Digital Predistorter for Power Amplifiers with Real Time Modeling of Memoryless Complex Gains" by Jeckeln et al; 1996 IEEE MTT–S Digest, pp. 835–838.

*Primary Examiner*—Steven Mottola
*Attorney, Agent, or Firm*—Charles E. Wands

[57] ABSTRACT

A digitally implemented, look-up table-based, predistortion and feed-forward correction signal processing mechanism compensates for distortion generated in the RF power amplifier. The input signal to the RF amplifier is stored for comparison with the measured the RF output. In each of predistortion and feed-forward signal processing paths, the magnitude of the complex waveform of the input signal is extracted to derive a read-out address to a dual-port RAM which stores weights to be multiplied by the input signal. In the predistortion signal processing path, the product is coupled to the RF power amplifier. In the feed-forward correction loop, the product is amplified by an auxiliary feed-forward RF amplifier and coupled into the amplified output signal path of the RF power amplifier.

58 Claims, 3 Drawing Sheets

ADAPTIVE DIGITAL PREDISTORTION LINEARIZATION AND FEED-FORWARD CORRECTION OF RF POWER AMPLIFIER

FIELD OF THE INVENTION

The present invention relates in general to communication systems, and is particularly directed to an adaptive digital RF power amplifier predistortion mechanism, that is combinable with an auxiliary digital feed-forward error correction loop, for effectively canceling amplitude and phase distortion in the amplified signal and thereby linearizing the operation of a microwave/RF power amplifier.

BACKGROUND OF THE INVENTION

Communication services providers are subject to very strict bandwidth usage spectrum constraints, such as technically mandated specifications and regulations imposed by the Federal Communications Commission (FCC), which currently requires that sideband spillage, namely the amount of energy spillover outside a licensed band of interest, be sharply attenuated (e.g., on the order of 50 dB). While such limitations are adequate for traditional forms of modulation such as FM, they are difficult to achieve using more contemporary, digitally based modulation formats, such as M-ary modulation. To keep the side-bands attenuated sufficiently so as to meet industry or regulatory-based requirements using such modulation techniques dictates the use of very linear signal processing systems and components. Although linear components can be implemented at a reasonable cost at relatively low bandwidths (baseband) used in telephone networks, linearizing such components, in particular power amplifiers, at RF frequencies becomes a very costly exercise.

RF power amplifiers are inherently non-linear devices, and generate unwanted intermodulation products, which manifest themselves as spurious signals in the amplified output signal, separate and distinct from the input signal. A further source of RF amplifier distortion is the presence of spectral regrowth or spreading of a compact spectrum into spectral regions that do not appear in the input signal. The distortion introduced by an RF amplifier causes the phase and amplitude of its amplified output signal to depart from the respective phase and amplitude of the input signal, and may be considered as an incidental (and undesired) amplifier-sourced modulation of the input signal.

One brute force technique for linearizing an RF power amplifier is to build the amplifier as large, high power device and then operate the amplifier at a low power level that is only a small percentage of its rated output power, where the RF amplifier's transfer function is relatively linear. The obvious drawback to this approach is the overkill penalty—high cost and large size.

Other prior art attempts to account for RF amplifier degradation have included the installation of a 'post-processing', feed-forward correction loop that is coupled with the amplifier's output signal, and a 'pre-processing', or 'predistortion' correction loop coupled in the path of the amplifier's input signal. The purpose of a post-processing, feed-forward correction loop is to extract the amount of error (distortion) present in the RF amplifier's output signal, amplify that extracted distortion signal to the proper level, and then reinject (the complement of) the amplified error signal back into the output path of the amplifier, such that (ideally) the amplifier distortion is effectively canceled.

A predistortion mechanism, on the other hand, serves to inject a 'predistortion' signal into the RF amplifier's input

2 signal path. The predistortion signal has a characteristic that has been predetermined to be ideally equal and opposite to the distortion expected at the output of the high power RF amplifier, so that when subjected to the transfer function of the RF amplifier, it will effectively cancel its anticipated distortion behavior. The predistortion mechanism may be made adaptive by extracting the error signal component in the output of the RF amplifier and adjusting the predistortion signal in accordance with the such extracted error behavior of the RF amplifier during real time operation, so as to effectively continuously minimize distortion in the amplifier's output.

In the past, such correction mechanisms have been implemented using discrete analog components, which are not capable of precisely tracking and compensating the highly non-linear behavior of the RF amplifier, so that they provide only a limited degree of linearization. This less than ideal performance of such components limits the linearity requirements that can be imposed upon cellular and PCS communications bands and thereby reduces bandwidth availability.

SUMMARY OF THE INVENTION

In accordance with the present invention, advantage is taken of continued improvements in the speed and memory capacity of digital signal processors and application specific integrated circuit (ASIC) technology, to perform predistortion and feed-forward correction signal processing in the digital domain. Carrying out such signal processing in the digital domain allows a very precise representation of the amplifier's non-linear transfer function to modelled and iteratively adjusted, as necessary, so as to completely compensate for both AM to AM and AM to PM distortion generated in the RF power amplifier. In addition, the predistortion and feed-forward correction signal processing mechanism of the invention compensates for short term thermal heating effects due to input power.

For this purpose, in the predistortion signal processing path, the input signal to the RF amplifier is stored for comparison with the measured the output. To process the RF amplifier's input and output signals in the digital domain, the signals are down-converted to near baseband, and then digitized. Alternatively, digital baseband data may be used as the input signal. (Digitized baseband signals can be readily interfaced to digital baseband cellular basestations.)

The complex baseband signal is composed of in-phase (I) and quadrature-phase (Q) components. The magnitude of the complex waveform of the input signal is extracted by means of a magnitude detector and applied to a leaky integrator filter. The leaky integrator is the digital equivalent of an RC filter, having a time constant equal to the thermal time constant of the RF power amplifier. Thus, the output of the leaky integrator will estimate the current thermal condition of the amplifier. This estimate is combined (concatenated) with the output of the instantaneous power estimate provided by the magnitude detector into a read-out address code. This read-out address code is coupled to an address input of a dual-port RAM to read out a current value of a complex predistortion (feed-forward correction) weight, previously derived and stored in the RAM.

It should be noted that it is important to compensate for the thermal variations in the amplifier, since the required predistortion weight will be slightly different at different temperatures. This predistortion weight is thus retrieved with temperature as part of the address, so that a given weight is used for a given power level, and a given temperature.

The read out weight is coupled to a multiplier to which the input signal is applied. The output of the multiplier is the complex product of the input signal by the weight. This product is coupled to a digital-to-analog converter, the output of which is filtered and then upconverted from baseband to RF and applied to the RF power amplifier.

Because of the non-linear characteristics of the RF amplifier, its output signal will contain phase and amplitude distortion. This is equivalent to the complex envelope of the output signal being distorted by a complex quantity. The output signal from the RF amplifier is down-converted to baseband and then coupled through a filter to an A-D converter wherein the (complex) output signal is digitized. The digitized output signal is coupled to a complex value divider, the output of which is coupled to a (complex value) multiplier. The divider is also coupled to receive the output of a delay to which the input signal is coupled. The delay corresponds to the throughput delay of the RF amplifier, and is effective to (time)-align the input and output signals. The divider divides the (complex) delayed input signal by the sampled complex amplified output signal producing a (complex) quotient representative of the ratio of the input signal and the output signal. The multiplier is also coupled to receive a complex delayed version of the weight read out of memory.

By multiplying the (complex) quotient by the delayed weight, the multiplier produces an output product that is the complex inversion of the distortion produced by the RF amplifier for a given power level and thermal condition. To control the rate of adaptation, the output of the multiplier is filtered in a loop filter, which is preferably implemented as a linear finite impulse response (FIR) filter, that combines the delayed complex weight read out of memory with the complex weight estimate produced by the multiplier.

The filtered complex weight estimate is then coupled to a write data port of the dual port RAM. The write address of the dual port RAM is derived at the output of a delay circuit, which is operative to delay the read-out address code and to produce a delayed write-in address code.

In the feed-forward correction signal processing path, the digitized baseband input signal is also supplied to an address generator which may be configured identically to the address generator of the predistortion embodiment, and is operative to generate respective read-out and write-in addresses for a feed-forward correction coefficient memory. A feed-forward correction weight read out from memory is coupled to a first multiplier, which also receives the digitized input signal. The output of the multiplier corresponds to the (complex) product of the input signal by a feed-forward correction weight read out of RAM.

This complex product is coupled to a DAC the output of which is filtered and then coupled through an up-converter wherein the filtered signal is up-converted from baseband to RF and applied to an auxiliary error amplifier. The output of the auxiliary error amplifier is an amplified feed-forward error correction signal that is injected into the output path of the main RF amplifier.

Similar to the predistortion embodiment, in order to derive feed-forward correction coefficients that are stored and iteratively updated in memory, the (complex) output signal generated by the RF power amplifier is extracted. The output signal consists of the signal multiplied by a complex distortion vector. The output signal from the RF amplifier is coupled to a down-converter wherein the amplified signal is (quadrature) down-converted to baseband, and then coupled through a filter and digitized.

After being down-converted to baseband, filtered and digitized into a complex sampled quantity the signal is coupled to a divider which is also coupled to the output of a time-aligning delay to which the input signal is coupled. As in the predistortion embodiment, the delay imparts a delay corresponding to the throughput delay of the direct signal flow path through the RF amplifier, and is effective to align the input and output signals to the divider. The divider is operative to divide the (complex) output signal by the delayed input signal, producing a complex distortion vector which is coupled to a substraction unit. The output of the divider is effectively the inverse of the output of the divider in the predistortion embodiment.

The subtraction unit is further coupled to receive a complex alignment vector and generates an output representative of the difference between the complex alignment vector and the complex distortion vector produced by the divider, corresponding to the amount of excess voltage required for the feed-forward weight. This difference value is multiplied by a complex output alignment vector that is effective to align the output of the RF error amplifier with the output of the main RF amplifier in amplitude and phase. The resulting product is the complex feed-forward correction signal.

As in the predistortion embodiment, in order to control the rate of adaptation, the output of the multiplier is filtered in a loop filter, which combines the delayed feed-forward correction value from a delay circuit coupled to the output of the RAM with the feed-forward correction estimate. The filtered feed-forward weight estimate is then written into the RAM.

A combined predistortion and feed-forward correction signal processing architecture is comprised of a predistortion signal processing stage and a feed-forward signal processing stage. A digitized baseband input signal is supplied to an address generator, which produces readout and write-in addresses for the weight/coefficient memories of the respective predistortion and feed-forward stages. The predistortion signal generated by predistortion stage is coupled to the input of the main RF amplifier, while the feed-forward correction signal produced by feed-forward correction stage is amplified in the auxiliary error amplifier and injected into the output path of the main RF amplifier.

DETAILED DESCRIPTION

Before describing in detail the new and improved adaptive digital RF power amplifier distortion compensation mechanism in accordance with the present invention, it should be observed that the invention resides primarily in what is effectively a prescribed arrangement of conventional communication circuits and associated digital signal processing components and attendant supervisory control circuitry, that controls the operations of such circuits and components. Consequently, the configuration of such circuits components and the manner in which they are interfaced with other communication system equipment have, for the most part, been illustrated in the drawings by readily understandable block diagrams, which show only those specific details that are pertinent to the present invention, so as not to obscure the disclosure with details which will be readily apparent to those skilled in the art having the benefit of the description herein. Thus, the block diagram illustrations are primarily intended to show the major components of the system in a convenient functional grouping, whereby the present invention may be more readily understood.

In order to facilitate an understanding of the present invention, it is initially useful to examine the nature of the distortion caused by the RF amplifier. AM/AM and AM/PM distortion introduced by the amplifier can be modeled as functions of the magnitude of the complex envelope of the RF input signal. By detecting the complex envelopes of the RF amplifier's input and output signals, a set of complex predistortion correction weights may be calculated. Predistortion correction is accomplished by multiplying the complex envelope of the input signal by a predistortion weight and then applying the predistortion product signal as the input to the RF amplifier. The amplifier then 'distorts' this predistortion product signal into what is effectively a 'clean' amplified output signal.

Since the RF amplifier's distortion can be characterized by the magnitude of the input signal's complex envelope, the compensation weight can also. As a consequence, a compensation weight can be stored in accordance with the magnitude of the envelope of the input signal. Once this weight has been calculated, then, in response to receipt of an input signal with the same envelope power, the previously calculated and stored weight can be used to correct it. This requires the storage of weights for many input power levels.

It should also be noted that the distortion in the RF power amplifier changes with temperature. However, short term variations in temperature are caused by the recent magnitude of the complex envelope of the RF output signal. The thermal estimate of the amplifier is derived from the magnitude of the complex envelope of the input signal. Since the recent RF output signal corresponds to the RF input signal, the recent history of the magnitude of the input can be used to characterize the thermal condition of the RF power amplifier. This allows the creation of a two dimensional look up table, the contents of which are the distortion compensation weights.

The address of the columns of the look-up table are controlled by the instantaneous envelope power of the input signal, and the address of the rows of the table are controlled as a function of the same input power levels. This function corresponds to the leaky integrator, reference above, which provides an estimate of the current thermal condition of the amplifier, which is combined with the instantaneous power estimate to controllably access the value of a previously stored complex predistortion weight.

As noted previously, it is important to compensate for the thermal variations in the amplifier, as the required predistortion weight will be slightly different at different temperatures. Thus, the predistortion weight is retrieved with temperature as part of the address, so that a given weight is used for a given power level, and a given temperature.

Figure 1:
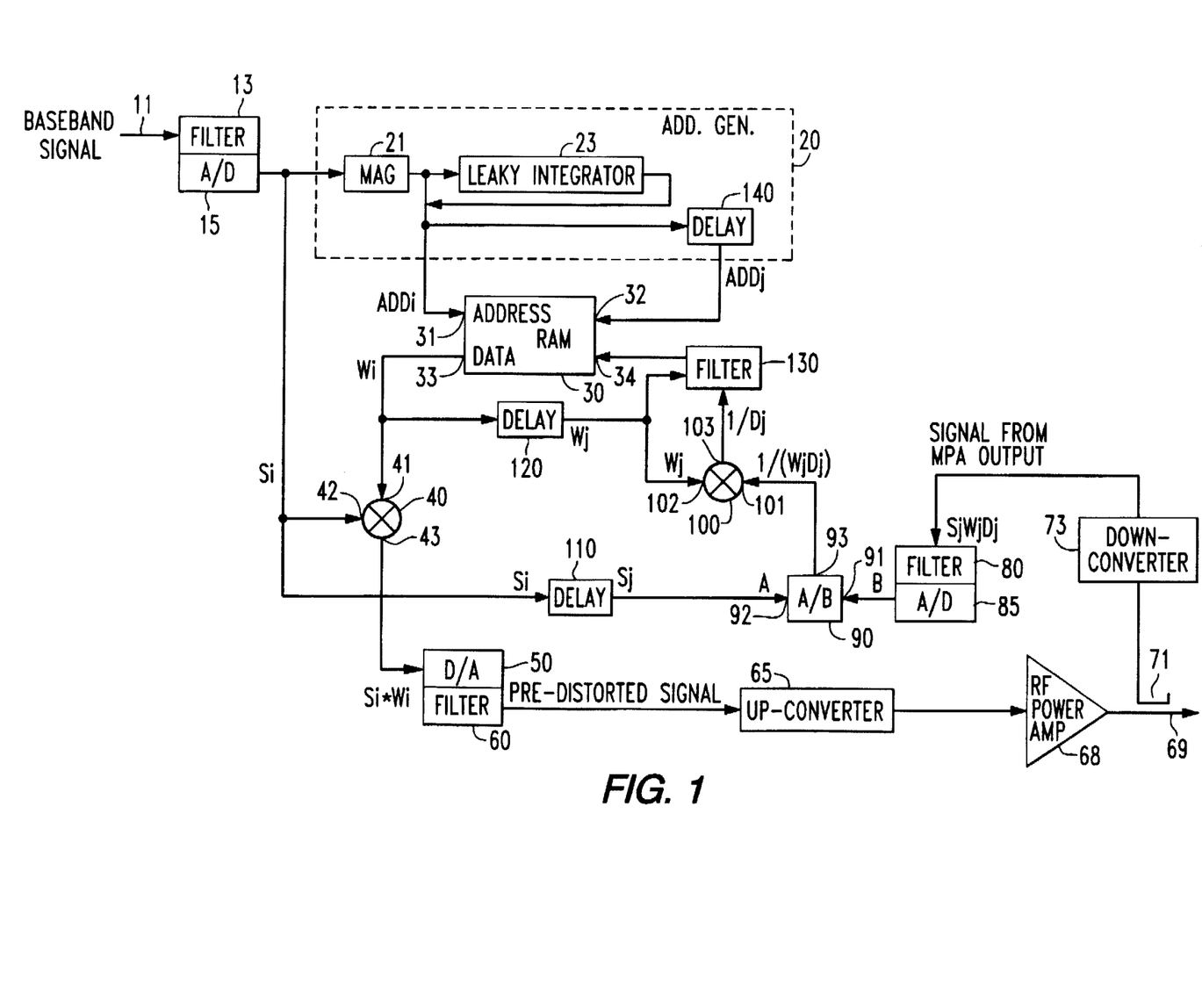
FIG. 1 diagrammatically illustrates an embodiment of a digitally implemented, look-up table-based, adaptive RF amplifier predistortion signal processing architecture in accordance with the present invention.

FIG. 1 diagrammatically illustrates a digitally implemented, look-up table-based, signal processing architecture that may be employed in the adaptive RF amplifier predistortion mechanism of the present invention. To simplify the illustration, down-conversion and up-conversion circuitry has not been shown. In addition, although only a single signal path is shown, it may be understood that the baseband input signal being processed, denoted as Si, is composed of in-phase (I) and quadrature-phase (Q) components. (As noted previously, in an alternative arrangement, digital baseband data signals, which may be readily interfaced to digital baseband cellular basestations, may be used as the input signal.) As shown in FIG. 1, the (complex) baseband input signal Si is coupled over a link 11 through an input filter 13 and then digitized by means of a digital-to-analog converter 15. The baseband input signal Si is supplied to an address generator 20, which generates read-out and write-in addresses for a predistortion coefficient memory 30. For this purpose, the magnitude of the complex waveform of the baseband input signal Si is extracted by means of magnitude detector 21 and applied to a filter 23, which is implemented as a leaky integrator, described above, that mimics the rise and fall thermal time constants in the RF amplifier whose distortion behavior is to be corrected.

The output of the leaky integrator/filter 23 and the output of the magnitude detector 21 are combined to form a read address code (Addi), which is coupled to a read address input 31 of a look-up table, implemented as a dual-port RAM 30. This read address code ADDi is used to read out a current value of a predistortion weight previously derived and stored in the RAM 30. The predistortion weight read out from an output port 33 of RAM 30 is coupled to a first input 41 of a multiplier 40. As described above, this compensates for the thermal variations in the amplifier, as the required predistortion weight will be slightly different at different temperatures, so that the predistortion weight is read out of RAM 30 using temperature as part of the address, so that a given weight is used for a given power level, and a given temperature.

Multiplier 40 has a second input 42 to which the digitized input signal Si is applied. The output 43 of multiplier 40, which represents the product of the input signal Si by the weight Wi, is coupled to a digital-to-analog converter (DAC) 50. The output of the DAC 50 is filtered in a filter 60, and then coupled to an up-converter 65, wherein the filtered signal is up-converted from baseband to RF and applied to RF power amplifier 68.

As described above, because of the non-linear behavior of the RF amplifier, its output signal So will be distorted, which can be modeled as a complex quantity D. The output signal produced by amplifier 68 is denoted as a complex quantity Sj*Wj*Dj, wherein j indicates a data value sampled/processed at a time j later than or subsequent to a time i. A sample of the output signal, So, from the RF amplifier 68, as applied to the output signal path 69, is derived from a directional coupler 71. The output sample is coupled to a down-converter 73, wherein the output signal is down-converted to baseband, and then coupled through a filter 80 to an A-D converter 85, wherein the (complex) output signal is digitized.

The digitized output signal Sj*Wj*Dj is coupled to a first input 91 of a divider 90, the output 93 of which is coupled to a first input 101 of a multiplier 100. A second input 92 of divider 90 is coupled to the output of a delay 110 to which the input signal Si is coupled. The delay imparted by delay 110 corresponds to the throughput delay of the direct signal flow path through the RF amplifier 68, and is effective to align the input and output signals to divider 90. Thus, divider 90 is operative to divide the (complex) delayed input signal Sj by the output signal Sj*Wj*Dj, producing the quotient 1/(Wj*Dj), which is coupled to the first input 101 of multiplier 100, as described above.

Multiplier 100 has a second input 102 coupled to receive a delayed weight Wj, derived from a delay circuit 120, which is coupled to receive the weight Wi as read out from the data output port 33 of RAM 30. By multiplying the quotient 1/(Wj*Dj) by the delayed weight Wj, multiplier 100 produces an output product 1/Dj at its output 103. This output product 1/Dj is the complex inversion of the distortion produced by the RF amplifier 68 for a given power level and thermal condition.

To control the rate of adaptation, the output 103 of multiplier 100 is filtered in a loop filter 130. Loop filter 130 is preferably implemented as a linear finite impulse response (FIR) filter, that combines the delayed weight Wj from delay circuit 120 with the weight estimate 1/Dj produced by multiplier 100. The filtered weight estimate is then coupled to a write data port 34 of RAM 30. The write address 32 of RAM 30 is derived at the output of a delay circuit 140, which is operative to delay the read-out address code ADDi and to produce a delayed write-in address code ADDj.

In operation, as a respective weight Wi that has been generated and updated in the manner described above is read out of the RAM 30, it is multiplied with the baseband signal Si in multiplier 40 to produce a 'predistorted' input signal. The predistorted input signal is then converted into analog format, filtered and up-converted to RF for application to the RF amplifier 68. Over time, for a given power level of the input signal Si, its associated amplifier distortion weight Dj will be incrementally updated and replaced in the look-up table RAM 30, so that the weights stored in memory will successively adapt for variations in amplifier parameters (e.g., temperature and age).

Figure 2:
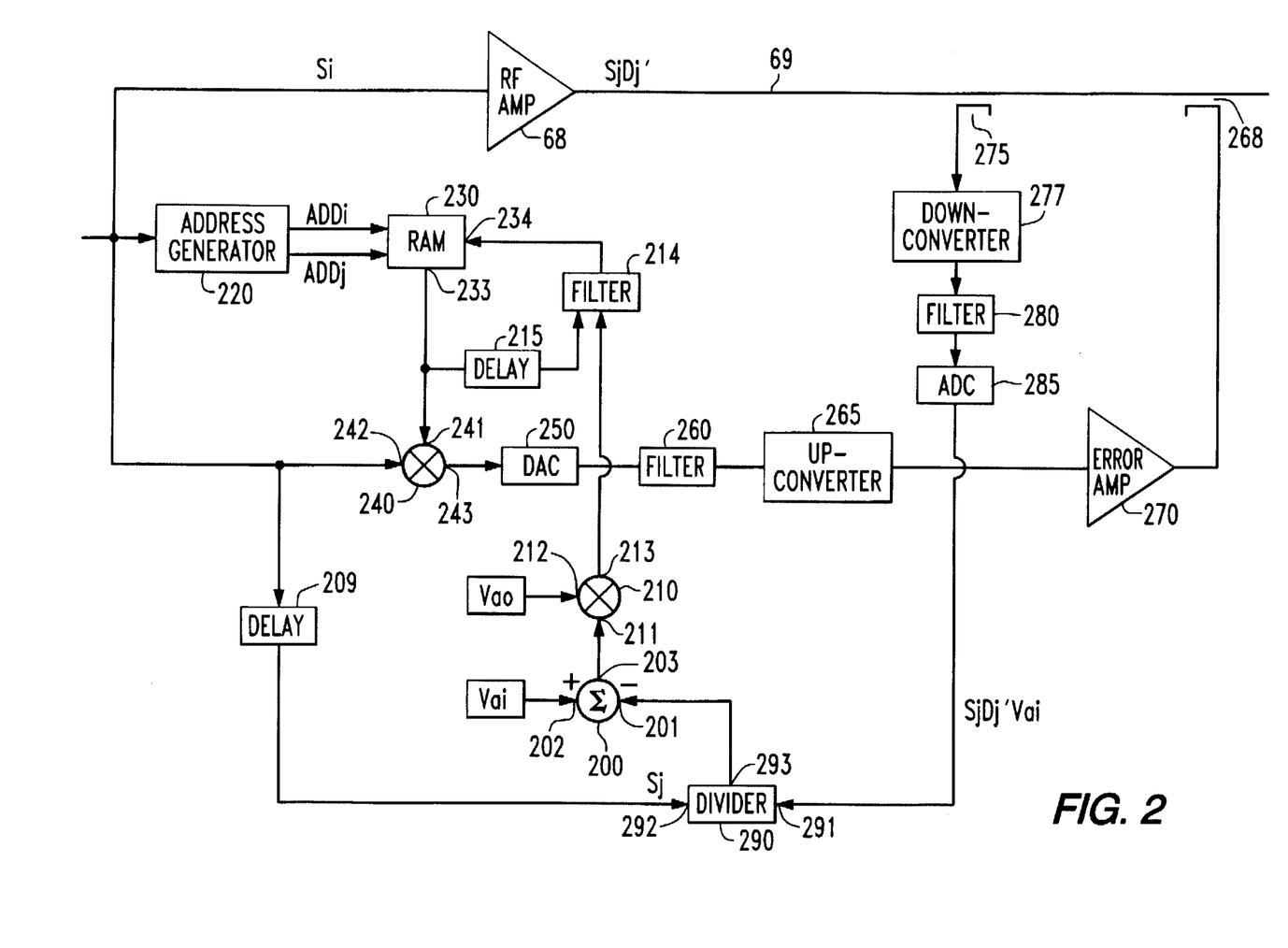
FIG. 2 diagrammatically illustrates an embodiment of a digitally implemented, look-up table-based, adaptive RF amplifier feed-forward correction signal processing architecture in accordance with the present invention.

FIG. 2 diagrammatically illustrates an embodiment of a digitally implemented, adaptive RF amplifier feed-forward correction mechanism in accordance with the present invention. Again, as in the case of the predistortion embodiment of FIG. 1, associated down-conversion and up-conversion circuitry has not been shown. Also, although only a single signal path is shown, the baseband input signal Si may be understood to be complex (composed of in-phase (I) and quadrature-phase (Q) components).

As in the predistortion scheme of FIG. 1, in the feed-forward correction arrangement of FIG. 2, the digitized (complex) baseband input signal Si is supplied to address generator 220, which may be configured identically to address generator 20 of the predistortion embodiment of FIG. 1, and is operative to generate respective read-out and write-in addresses ADDi and ADDj for a predistortion coefficient memory 230 (preferably implemented as a dual-port RAM). The read address code ADDi is used to read out a current value of a feed-forward correction weight previously derived and stored in memory RAM 230. This feed-forward correction weight is read out from an output port 233 of RAM 230 and coupled to a first input 241 of a multiplier 240.

Multiplier 240 has a second input 242 to which the digitized input signal Si is applied, and an output 243 which corresponds to the (complex) product of the input signal Si by the feed-forward correction weight Wi, read out of RAM 230. This complex product is coupled to a DAC 250, the output of which is filtered in a filter 260, and then coupled to an up-converter 265, wherein the filtered signal is up-converted from baseband to RF and applied to an auxiliary error amplifier 270 having a lower output power capability than that of the main RF amplifier 68. The output of error amplifier 270 is an amplified feed-forward error correction signal that is injected via a directional coupler 268 into the output path 69 of the main RF amplifier 68.

Similar to the predistortion embodiment of FIG. 1, in order to derive feed-forward correction coefficients that are stored and iteratively updated in RAM 230, the (complex) output signal generated by RF power amplifier 68 is extracted from output path 69 via a directional coupler 275. The output signal consists of the signal multiplied by a complex distortion vector. The output signal from the RF amplifier 68 as extracted from the output path 69 by directional coupler 275 is coupled to a down-converter 277, wherein the output signal is (quadrature) down-converted to baseband, and then coupled through a filter 280 to an A-D converter 285, wherein the (complex) output signal is digitized.

After being down-converted to baseband, filtered and digitized into a complex sampled quantity Sj*Dj'*Vai, the signal is coupled to a first input 291 of a divider 290. A second input 292 of divider 290 is coupled to the output of a time-aligning delay 210 to which the input signal Si is coupled. As in the predistortion embodiment of FIG. 1, the delay imparted by a delay 209 corresponds to the throughput delay of the direct signal flow path through the RF amplifier 68, and is effective to align the input and output signals to divider 290. Divider 290 is operative to divide the (complex) output signal by the delayed input signal, producing a complex distortion vector Dj'*Vai, which is coupled via an output 293 to the first input 201 of a substraction unit 200. (It may be noted that the output of divider 290 is effectively the inverse of the output of the divider 90 in the predistortion embodiment of FIG. 1, described above.)

Subtraction unit 200 has a second input 202 to which a complex alignment vector Vai is applied. The output 203 of subtractor 200 is representative of the difference Vai(1-Dj') between the complex alignment vector Vai and the complex distortion vector Dj'*Vai produced by divider 290, and corresponds to the amount of a residual error voltage required for the feed-forward weight. This difference value Vai(1-Dj') is coupled to a first input 211 of a multiplier 210. A second input 212 of multiplier 210 is coupled to receive a complex output alignment vector Vao. Complex output alignment vector Vao is effective to align the output of the RF error amplifier 270 with the output of the main RF amplifier 68 in amplitude and phase, in order to eliminate clipping in the waveform at the output of RF amplifier 68. Each of alignment vectors Vai and Vao may be derived by means of conventional phase and amplitude alignment circuitry, not shown. From its output 213, multiplier 210 produces a product which is the complex feed-forward correction weight for a given power level and thermal condition.

As in the predistortion embodiment of FIG. 1, in order to control the rate of adaptation, the output 213 of multiplier 210 is filtered in a loop filter 214, which may be implemented as a linear (FIR) filter. Filter 214 combines the delayed feed-forward correction value from a delay circuit 215, coupled to the output 233 of RAM 230, with the feed-forward correction estimate produced by multiplier 210. The filtered feed-forward weight estimate is then coupled to a write data port 234 of RAM 230.

The operation of the feed-forward embodiment of FIG. 2 is similar to that of the predistortion embodiment of FIG. 1, described above, but operates independently of the predistortion embodiment. Namely, as a respective feed-forward weight is read out of the RAM 230, it is multiplied with the baseband signal Si in multiplier 240 to produce a feed-forward correction signal. This feed-forward correction signal is then converted into analog format, filtered and up-converted to RF and amplified for application to the auxiliary error amplifier 68. Again, for a given power level of the input signal Si, over time the respective feed-forward correction weights will be incrementally updated and replaced in the look-up table RAM 230, so that the weights stored in memory will successively adapt for variations in parameters (e.g., temperature and age) of the main RF amplifier 68.

Figure 3:
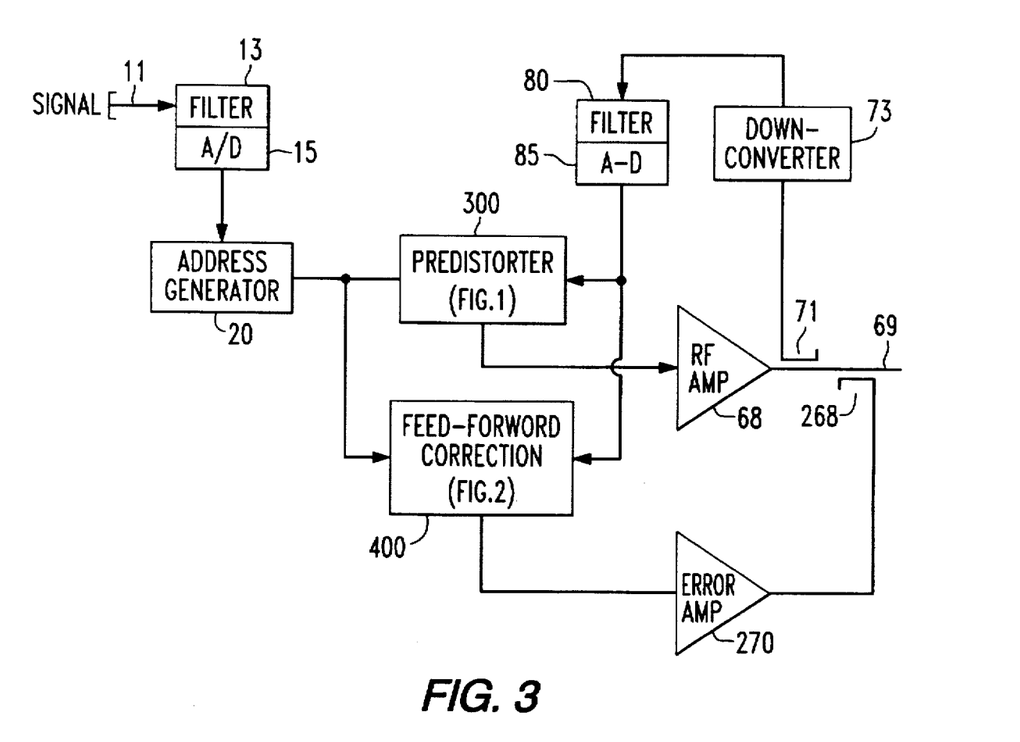
FIG. 3 diagrammatically illustrates a combined predistortion and feed-forward correction signal processing arrangement comprised of the respective signal processing architectures of FIGS. 1 and 2.

FIG. 3 diagrammatically illustrates a combined predistortion and feed-forward correction signal processing architecture, containing a predistortion signal processing stage 300 and a feed-forward signal processing stages 400, which are respectively implemented in the manner described above with reference to FIGS. 1 and 2. Namely, the digitized (complex) baseband input signal Si that has been processed through input filter 13 and DAC 15 is supplied to an address generator 20. Address generator read-out and write-in addresses for weight/coefficient memories 30 and 230 in stages 300 and 400 respectively, in the manner described above. The predistortion signal generated by predistortion stage 300 is coupled to the input of main RF amplifier 68, while the feed-forward correction signal produced by feed-forward correction signal stage 400 is amplified in auxiliary error amplifier 270 and injected via directional coupler 268 into the output path 69 of RF amplifier 68.

As will be appreciated from the foregoing description, the present invention takes advantage of the speed and memory capacity of digital signal processors to perform predistortion and feed-forward correction signal processing in the digital domain, where a very precise representation of an RF power amplifier non-linear transfer function can be modelled and iteratively adjusted so as to compensate for AM to AM and AM to PM distortion, as well as short term thermal heating effects due to RF input power.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A method for correcting amplitude and phase distortion in an RF power amplifier comprising the steps of:

(a) providing a digitized input signal representative of the complex envelope of a signal to be amplified by said RF power amplifier and a digitized output signal representative of the complex waveform of an amplified signal derived from said RF power amplifier;

(b) performing RF amplifier distortion measurements on said digitized input and output signals provided in step (a), so as to generate first weights representative of said amplitude and phase distortion;

(c) storing said first weights in memory;

(d) accessing a respective one of said first weights stored in memory in accordance with an input signal to be amplified by said RF power amplifier;

(e) predistorting said input signal to said RF power amplifier in accordance with said respective one of said first weights accessed from memory to derive a predistorted input signal; and (f) applying said predistorted input signal to said RF amplifier.

2. A method according to claim 1, further including the steps of:

(g) performing RF amplifier distortion measurements on said digitized signal input and output signals provided in step (a), so as to generate second weights representative of said amplitude and phase distortion;

(h) storing said second weights in memory;

(i) accessing a respective one of said second weights stored in memory in accordance with an input signal to be amplified by said RF power amplifier;

(j) modifying said input signal in accordance with said respective one of said second weights accessed from memory to derive a feed-forward correction signal; and (k) combining said feed-forward correction signal with an amplified output signal from said RF power amplifier.

3. A method according to claim 2, wherein step (g) comprises adaptively adjusting said second weights in accordance with said successive ones of said RF amplifier distortion measurements on said digitized input and output signals.

4. A method according to claim 1, wherein step (b) comprises adaptively adjusting said first weights in accordance with said successive ones of said RF amplifier distortion measurements on said digitized input and output signals.

5. A method according to claim 2, wherein step (k) includes amplifying said feed-forward correction signal by means of an auxiliary RF error amplifier having an operational power range less than that of said RF power amplifier, and coupling the amplified feed-forward correction signal to the amplified output signal from said RF power amplifier.

6. A method according to claim 2, wherein said first and second weights are based upon envelope-dependency of distortion-introducing behavior of said RF power amplifier.

7. A method according to claim 1, wherein step (b) comprises deriving said first complex weights in accordance with the complex division of complex envelopes of said input signal by said output signal, and wherein step (e) comprises multiplying the complex envelope of said RF input signal by said respective one of said first complex weights accessed in step (d) to derive said predistorted input signal.

8. A method according to claim 7, wherein step (g) comprises deriving said second complex weights in accordance with the complex division of complex envelopes of said input signal by said output signal, and wherein step (j) comprises multiplying the complex envelope of said RF input signal by said respective one of said second weights accessed in step (i) to derive said feed-forward correction signal.

9. A method according to claim 2, wherein steps (d) and (i) respectively comprise accessing first and second weights stored in memory in dependence upon the baseband power in said input signal to be amplified by said RF power amplifier.

10. A method according to claim 9, wherein steps (d) and (i) respectively comprise accessing first and second weights stored in memory which have the same baseband power as said input signal to be amplified by said RF power amplifier.

11. A method according to claim 2, wherein steps (b) and (g) comprise generating respective read out address codes for accessing first and second weights stored in memory in accordance with the magnitude of the complex waveform of said input signal.

12. A method according to claim 11, wherein step (e) comprises multiplying an input signal to said RF power amplifier by a respective one of said first weights read out from memory to derive said predistorted input signal.

13. A method according to claim 11, wherein step (j) comprises multiplying an input signal to said RF power amplifier by a respective one of said second weights read out from memory to derive said feed-forward correction signal.

14. A method according to claim 1, wherein step (b) comprises generating a quotient representative of a ratio of said input signal and said output signal, and multiplying said quotient by said respective one of said first weights to produce an adaptively adjusted value of said respective one of said first weights.

15. A method according to claim 5, wherein step (g) comprises generating a quotient representative of a ratio of said input signal and said output signal, subtracting said quotient from an alignment vector and multiplying said quotient by an output alignment vector which is effective to align the output of said auxiliary error amplifier with the output of said RF power amplifier in amplitude and phase, to produce an adaptively adjusted value of said respective one of said second weights.

16. A method according to claim 2, wherein steps (c) and (h) comprise generating respective write address codes for storing first and second weights in memory in accordance with a delayed version of the magnitude of the complex waveform of said input signal.

17. A method for correcting amplitude and phase distortion in an RF power amplifier comprising the steps of:

(a) providing a digitized input signal to be amplified by said RF power amplifier and a digitized amplified output signal derived from said RF power amplifier;

(b) performing RF amplifier distortion measurements on said digitized input and output signals provided in step (a), so as to generate feed-forward correction weights representative of said amplitude and phase distortion;

(c) storing said feed-forward correction weights in memory;

(d) accessing a respective one of said feed-forward correction weights stored in memory in accordance with an input signal to be amplified by said RF power amplifier;

(e) modifying said input signal in accordance with said respective one of said feed-forward correction weights accessed from memory to derive a feed-forward correction signal; and (f) combining said feed-forward correction signal with an amplified output signal from said RF power amplifier.

18. A method according to claim 17, wherein step (b) comprises adaptively adjusting said feed-forward correction weights in accordance with said successive ones of said RF amplifier distortion measurements on said digitized input and output signals.

19. A method according to claim 17, wherein step (f) includes amplifying said feed-forward correction signal by means of an auxiliary RF error amplifier having an operational power range less than that of said RF power amplifier, and coupling the amplified feed-forward correction signal to the amplified output signal from said RF power amplifier.

20. A method according to claim 17, wherein said feed-forward correction weights are based upon envelope-dependency of distortion-introducing behavior of said RF power amplifier.

21. A method according to claim 17, wherein step (b) comprises performing RF amplifier distortion measurements on the complex envelopes of the RF amplifier's input and output signals to generate feed-forward complex weights.

22. A method according to claim 21, wherein step (b) comprises deriving said feed-forward correction complex weights in accordance with the complex division of complex envelopes of said input signal by said output signal.

23. A method according to claim 17, wherein step (d) comprises accessing feed-forward correction weights stored in memory in dependence upon the baseband power in said input signal to be amplified by said RF power amplifier.

24. A method according to claim 17, wherein step (b) comprises generating respective read out address codes for accessing feed-forward correction weights stored in memory in accordance with the magnitude of the complex waveform of said input signal.

25. A method according to claim 24, wherein step (e) comprises multiplying an input signal to said RF power amplifier by a respective one of said second weights read out from memory to derive said feed-forward correction signal.

26. A method according to claim 17, wherein step (b) comprises generating a quotient representative of a ratio of said input signal and said output signal, subtracting said quotient from an alignment vector and multiplying said quotient by an output alignment vector which is effective to align the output of said auxiliary error amplifier with the output of said RF power amplifier in amplitude and phase, to produce an adaptively adjusted value of said respective one of said second weights.

27. A method according to claim 17, wherein step (c) comprises generating a write address codes for storing feed-forward weights in memory in accordance with a delayed version of the magnitude of the complex waveform of said input signal.

28. A signal processing arrangement for correcting for amplitude and phase distortion in an RF power amplifier comprising:

a signal coupler which is operative to provide a digitized input signal representative of the complex envelope of a signal component to be amplified by said RF power amplifier and a digitized output signal representative of the complex envelope of an amplified signal component derived from said RF power amplifier;

a distortion measurement unit which is operative to perform RF amplifier distortion measurements on said digitized input signal and said digitized output signal so as to generate first weights representative of said amplitude and phase distortion;

a first memory which stores said first weights;

a memory access unit which is operative to controllably read out a respective one of said first weights from said first memory in accordance with an input signal to be amplified by said RF power amplifier; and a predistortion unit which is operative to predistort said input signal to said RF power amplifier in accordance with said respective one of said first weights read out by said first memory access unit so as to generate a predistorted input signal, which is applied to said RF amplifier.

29. A signal processing arrangement according to claim 28, further including a second memory and a feed-forward correction unit, and wherein said distortion measurement unit is further operative to perform RF amplifier distortion measurements on said digitized input signal and said digitized output signal to generate second weights representative of said amplitude and phase distortion, which are stored in said second memory, and wherein said memory access unit is operative to controllably read out a respective one of said second weights from said second memory in accordance with an input signal to be amplified by said RF power amplifier, and wherein said feed-forward correction unit is operative to modify said input signal in accordance with said respective one of said second weights to derive a feed-forward correction signal, and to combine said feed-forward correction signal with an amplified output signal from said RF power amplifier.

30. A signal processing arrangement according to claim 29, wherein said distortion measurement unit is operative to adaptively adjust said first and second weights in accordance with said successive ones of said digitized input signal and said digitized output signal.

31. A signal processing arrangement according to claim 30, wherein said feed-forward correction unit includes an auxiliary RF error signal amplifier having an operational power range less than that of said RF power amplifier, and which is operative to amplify said feed-forward correction signal, with the amplified feed-forward correction signal being combined with the amplified output signal from said RF power amplifier.

32. A signal processing arrangement according to claim 29, wherein said first and second weights are based upon envelope-dependency of distortion-introducing behavior of said RF power amplifier.

33. A signal processing arrangement according to claim 29, wherein said distortion measurement unit is operative to derive said first and second weights by performing complex division of complex envelopes of said input signal and output signal.

34. A signal processing arrangement according to claim 33, wherein said predistortion unit is operative to predistort said input signal to said RF power amplifier by multiplying the complex envelope of said input signal by said respective one of said first weights accessed from said first memory to derive said predistorted input signal.

35. A signal processing arrangement according to claim 33, wherein said feed-forward correction unit is operative to generate said feed-forward correction signal by multiplying the complex envelope of said input signal by said respective one of said second weights accessed from said second memory.

36. A signal processing arrangement according to claim 28, wherein said memory access unit is operative to controllably read out a respective one of said first weights from said first memory in dependence upon the baseband power in said input signal to be amplified by said RF power amplifier.

37. A signal processing arrangement according to claim 28, wherein said memory access unit is operative to generate a read out address code for accessing a first weight stored in said first memory in accordance with the magnitude of the complex waveform of said input signal.

38. A signal processing arrangement according to claim 37, wherein said predistortion unit is operative to multiply an input signal to said RF power amplifier by a respective one of said first weights read out from said first memory to derive said predistorted input signal, and wherein said feed-forward correction unit is operative to multiply an input signal by a respective one of said second weights read out from said second memory to derive said feed-forward correction signal.

39. A signal processing arrangement according to claim 28, wherein said distortion measurement unit is operative to generate quotient signals representative of ratios of said input signal and said output signal, and to multiply said quotient signals by first and second weights to produce an adaptively adjusted values of said first and second weights.

40. A signal processing arrangement according to claim 29, wherein said memory access unit is operative to generate respective write address codes for storing first and second weights in said first and second memories in accordance with a delayed version of the magnitude of the complex waveform of said input signal.

41. A signal processing arrangement for correcting for amplitude and phase distortion in an RF power amplifier comprising:

a signal coupler which is operative to provide a digitized input signal component to be amplified by said RF power amplifier and a digitized amplified output signal component derived from said RF power amplifier;

a distortion measurement unit which is operative to perform RF amplifier distortion measurements on said digitized signal components so as to generate feed-forward correction weights representative of said amplitude and phase distortion;

a memory which stores said feed-forward correction weights;

a memory access unit which is operative to controllably read out a respective one of said feed-forward correction weights from memory in accordance with an input signal to be amplified by said RF power amplifier; and a feed-forward correction unit including an auxiliary RF error amplifier which is operative to modify said input signal to said RF power amplifier in accordance with said respective one of said feed-forward correction weights read out of memory and to generate an amplified modified input signal, which is combined with the output of said RF amplifier.

42. A signal processing arrangement according to claim 41, wherein said distortion measurement unit is operative to adaptively adjust said feed-forward correction weights in accordance with said successive ones of said digitized signal components.

43. A signal processing arrangement according to claim 41, wherein said auxiliary RF error signal amplifier has an operational power range less than that of said RF power amplifier.

44. A signal processing arrangement according to claim 41, wherein said feed-forward correction weights are based upon envelope-dependency of distortion-introducing behavior of said RF power amplifier.

45. A signal processing arrangement according to claim 41, wherein said distortion measurement unit is operative to derive said feed-forward correction weights by performing complex division of complex envelopes of said input signal and said output signal.

46. A signal processing arrangement according to claim 44, wherein said feed-forward correction unit is operative to generate said feed-forward correction signal by multiplying the complex envelope of said input signal by a feed-forward correction weight accessed from memory.

47. A signal processing arrangement according to claim 41, wherein said memory access unit is operative to controllably read out a respective one of said feed-forward correction weights from memory in dependence upon the baseband power in said input signal to be amplified by said RF power amplifier.

48. A signal processing arrangement according to claim 47, wherein said memory access unit is operative to read out from a feed-forward correction weight having the same baseband power as said input signal to be amplified by said RF power amplifier.

49. A signal processing arrangement according to claim 41, wherein said memory access unit is operative to generate a read out address code for accessing a first weight stored in said first memory in accordance with the magnitude of the complex waveform of said input signal.

50. A signal processing arrangement according to claim 41, wherein said distortion measurement unit is operative to generate quotient signals representative of ratios of said input signal and said output signal, and to multiply said quotient signals by said feed-forward correction weights to produce an adaptively adjusted values of said feed-forward correction weights.

51. A signal processing arrangement according to claim 41, wherein said memory access unit is operative to generate respective write address codes for storing said feed-forward correction weights in memory in accordance with a delayed version of the magnitude of the complex waveform of said input signal.

52. A signal processing arrangement according to claim 41, wherein said distortion measurement unit is operative to generate a quotient representative of a ratio of said input signal and said output signal, subtract said quotient from an alignment vector and multiplying said quotient by an output alignment vector which is effective to align the output of said auxiliary error RF amplifier with the output of said RF power amplifier in amplitude and phase, to produce an adaptively adjusted value of a feed-forward correction weight.

53. A signal processing arrangement according to claim 52, wherein said memory access unit is operative to read out a respective one of said feed-forward correction weights from memory in accordance in accordance with temperature.

54. A signal processing arrangement according to claim 53, wherein said memory access unit includes a leaky integrator.

55. A method according to claim 1, wherein step (d) comprises accessing said respective one of said first weights in accordance with temperature.

56. A method according to claim 17, wherein step (d) comprises accessing said respective one of said feed-forward correction weights stored in memory in accordance with temperature.

57. A signal processing arrangement according to claim 28, wherein said memory access unit is operative to controllably read out said respective one of said first weights from said first memory in accordance with temperature.

58. A signal processing arrangement according to claim 57, wherein said memory access unit includes a leaky integrator.

* * * * *